(12) United States Patent
Chen et al.

(10) Patent No.: US 7,273,787 B2
(45) Date of Patent: Sep. 25, 2007

(54) METHOD FOR MANUFACTURING GATE DIELECTRIC LAYER

(75) Inventors: Wen-Ji Chen, Changhua County (TW); Tung-Po Chen, Taichung (TW); Kai-An Hsueh, Miaoli County (TW); Sheng-Hone Zheng, Tainan (TW)

(73) Assignee: Powerchip Semiconductor Corp., Hsinchu (TW)

( * ) Notice: Subject to any disclaimer, the term of this patent is extended or adjusted under 35 U.S.C. 154(b) by 137 days.

(21) Appl. No.: 11/164,332

(22) Filed: Nov. 18, 2005

(65) Prior Publication Data

US 2006/0281251 A1 Dec. 14, 2006

(30) Foreign Application Priority Data

Jun. 14, 2005 (TW) ................ 94119596 A (51) Int. Cl.
*H01L 21/8234* (2006.01)
(52) U.S. Cl. ............... 438/275; 438/287; 438/981; 257/E27.064
(58) Field of Classification Search ........ 438/275–279, 438/287, 294–297, 981; 257/E27.064
See application file for complete search history.

(56) References Cited

U.S. PATENT DOCUMENTS 6,417,037 B1 * 7/2002 Feng ..................... 438/216

* cited by examiner

*Primary Examiner*—H. Jey Tsai
(74) *Attorney, Agent, or Firm*—Jianq Chyun IP Office (57) ABSTRACT

A method for manufacturing a gate dielectric layer is provided. A substrate divided into at least a high voltage circuit region and a low voltage circuit region is provided. A first dielectric layer serving as gate dielectric layer in the high voltage circuit region is formed on the substrate. A mask layer is formed over the first dielectric layer. The mask layer, the first dielectric layer and the substrate are patterned to form trenches in the substrate. An isolation layer is formed to fill the trenches. The mask layer and part of the isolation layer are removed to expose the surface of the first dielectric layer. The first dielectric layer of the low voltage circuit region is removed to expose the surface of the substrate. A second dielectric layer having a thickness smaller than the first dielectric layer is formed on the substrate in the low voltage circuit region.

15 Claims, 6 Drawing Sheets

METHOD FOR MANUFACTURING GATE DIELECTRIC LAYER

CROSS-REFERENCE TO RELATED APPLICATION

This application claims the priority benefit of Taiwan application serial no. 94119596, filed on Jun. 14, 2005. All disclosure of the Taiwan application is incorporated herein by reference.

BACKGROUND OF THE INVENTION

1. Field of the Invention

The present invention relates to a method for manufacturing a semiconductor device. More particularly, the present invention relates to a method for manufacturing a gate dielectric layer.

2. Description of the Related Art

With the rapid development of the integrated circuit fabrication technologies, the production of highly efficient, highly integrated, low cost, light and compact electronic devices has become the design goal for many types of electronic products. At present, most semiconductor manufacturers need to fabricate devices with a variety of functions on the same chip in order to attain the above target.

Integrating both high voltage devices and low voltage devices together on the same chip is one of the methods that meet the above requirements. For example, low voltage devices can be used for fabricating control circuit and high voltage devices can be used for fabricating electrically programmable read-only-memory (EPROM), flash memory or the driving circuit of liquid crystal display.

However, in order to take a higher breakdown voltage, the thickness of the gate oxide layer in the high voltage devices frequently has to be greater than 200 Å, which is considerably greater than the thickness of the gate oxide layer in the low voltage devices. With this particular requirement, many problems emerge in the process of integrating the high voltage devices with the low voltage devices.

Figure 1A:
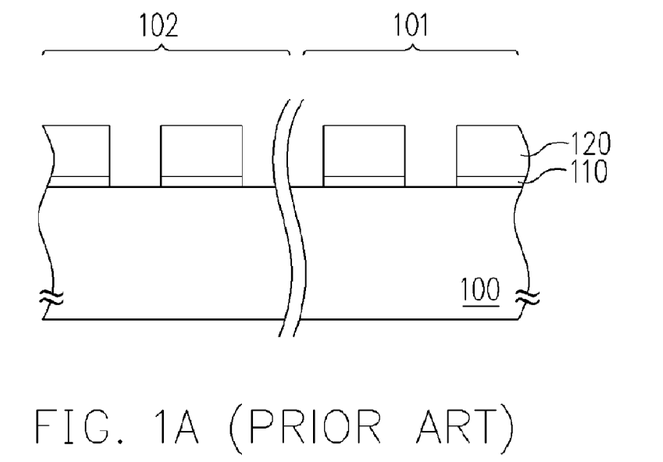
FIGS. 1A through 1F are schematic cross-sectional views showing the process of fabricating a conventional gate oxide layer.

FIGS. 1A through 1F are schematic cross-sectional views showing the process of fabricating a conventional gate oxide layer. First, as shown in FIG. 1A, a pad oxide layer 110 and a mask layer 120 are formed on a high voltage circuit region 101 and a low voltage circuit region 102 of a common substrate 100. Thereafter, the pad oxide layer 110 and the mask layer 120 are patterned.

Figure 1B:
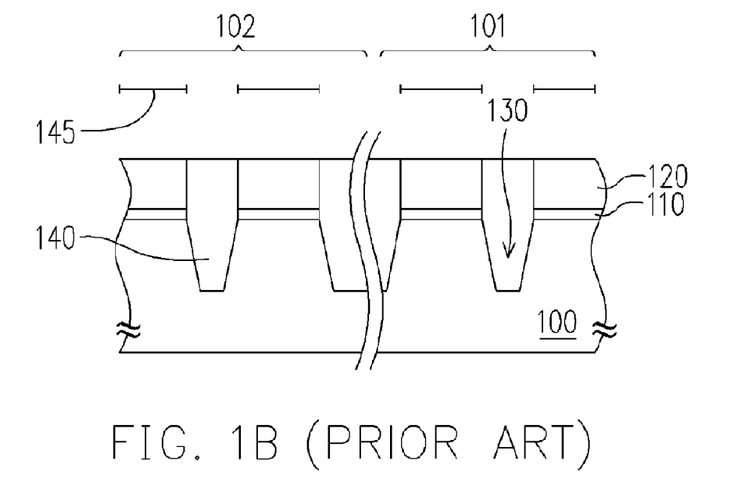

As shown in FIG. 1B, using the mask layer 120 as a mask, the substrate 100 is etched to from a trench 130. Thereafter, a silicon oxide layer 140 is formed over the substrate 100 to fill the trench 130 completely and cover the substrate 100. After that, the silicon oxide layer 140 is removed until the mask layer 120 is exposed and an active region 145 is simultaneously defined.

Figure 1C:
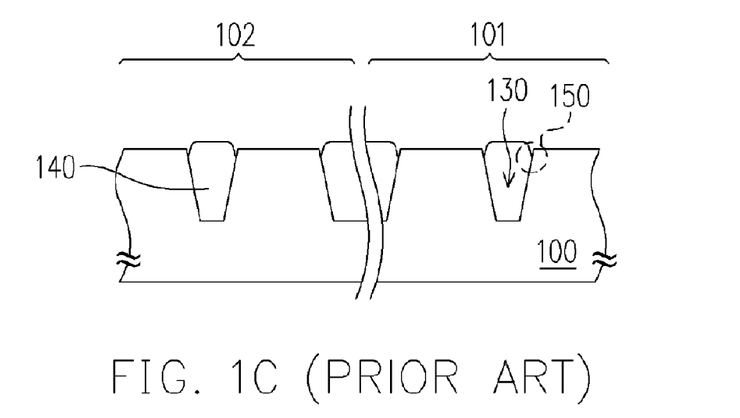

As shown in FIG. 1C, a wet etching operation is carried out to remove the mask layer 120 and the pad oxide layer 110. In the process of removing the mask layer 120 and the pad oxide layer 110 in the wet etching operation, the etching solution will erode parts of the silicon oxide layer to form divots 150 at the side corner regions of the trench 130.

Figure 1D:
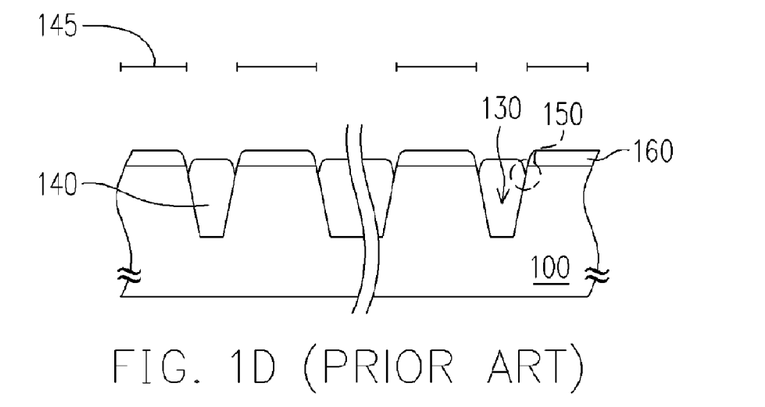

As shown in FIG. 1D, a thick high voltage gate oxide layer 160 is formed over the substrate 100. Due to the presence of divots 150, the rate of oxidation in the process of forming the gate oxide layer 160 will be affected around the corner regions of the shallow trench isolation structures close to the divots. Therefore, the high-voltage gate oxide layer 160 around the corner regions of the shallow trench isolation structures will have a thickness smaller than the high-voltage gate oxide layer 160 in the active region 145. Such non-uniformity in the thickness of the gate oxide layer is the so-called 'gate oxide thinning' phenomenon. This phenomenon often leads to electrical problems in the device and an undesirable drop in the reliability of the gate oxide layer.

Figure 1E:
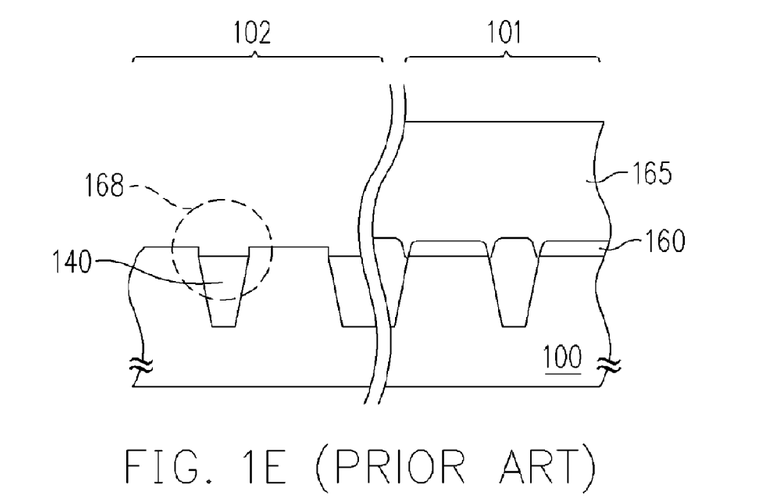

As shown in FIG. 1E, a photoresist layer 165 is formed to cover the high-voltage circuit region 102. Then, using the photoresist layer 165 as a mask, the high-voltage gate oxide layer 160 in the low-voltage circuit region 102 is removed. In the process of removing the high-voltage gate oxide layer to from the low-voltage circuit region 102, the silicon oxide 140 will also be etched because the silicon oxide layer 140 and the high-voltage gate oxide layer 160 are fabricated using the same oxide material. Hence, the shallow trench isolation structures (the silicon oxide layer 140) in the low-voltage circuit region 102 will have a depression 168.

Figure 1F:
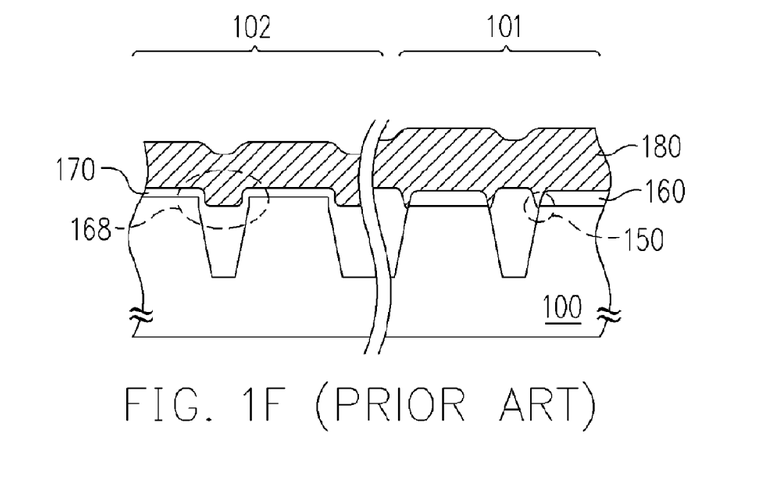

As shown in FIG. 1F, the photoresist layer 165 is removed and then a thin low-voltage gate oxide layer 170 is formed over the substrate 100 by performing an oxidation process. Then, a doped polysilicon layer 180 is formed over the substrate. After forming the doped polysilicon layer 180, a parasitic transistor is produced near the divots 150 at the corner regions of the shallow trench isolation structures in the high-voltage circuit region 101. During a normal memory operation, these parasitic transistors may produce current leaks. In other words, the divots 150 may accumulate electric charges and generate sub-threshold current in the integrated circuit leading to the so-called kink effect. The kink effect not only will lead to a drop in the quality of the device and a lowering of the stability and reliability of the device, but also will lead to a reduction in the process yield. On the other hand, because of the presence of a depression 168 in the low-voltage circuit region 102, doped polysilicon will fill the depression 168 area leading to junction leakage problems. Hence, not only is the power consumption increased, but the operating time of the device is also lengthened.

SUMMARY OF THE INVENTION

Accordingly, at least one objective of the present invention is to provide a method for forming a gate dielectric layer in a device such that the thinning of the gate dielectric layer at the corner regions of shallow trench isolation structures is prevented. Hence, the reliability and stability of the device is increased.

At least a second objective of the present invention is to provide a method for forming a gate dielectric layer in a device such that the problem of having a depression in the corner regions of shallow trench isolation structures in a low-voltage circuit region is resolved. Hence, junction leakage is prevented and the device can operate with a low power rating and a high operating rate.

To achieve these and other advantages and in accordance with the purpose of the invention, as embodied and broadly described herein, the invention provides a method for forming a gate dielectric layer. The method includes providing a substrate divided at least into a high-voltage circuit region and a low-voltage circuit region. Then, a first dielectric layer serving as gate oxide layer in the high voltage circuit region is formed on the substrate. Thereafter, a mask layer is formed over the first dielectric layer and then the mask layer, the first dielectric layer and the substrate are patterned to form trenches in the substrate. After that, an isolation layer is formed on the substrate to fill the trenches. The mask layer and part of the isolation layer are removed to expose the surface of the first dielectric layer. The first dielectric layer of the low voltage circuit region and part of the isolation layer are removed to expose the surface of the substrate. Then, a second dielectric layer is formed on the substrate in the low voltage circuit region such that the second dielectric layer has a thickness smaller than the first dielectric layer.

According to the method of forming a gate dielectric layer in the preferred embodiment of the present invention, a RCA cleaning operation is carried out before forming the first dielectric layer. The first dielectric layer has a thickness between 200 Å~1000 Å and the method of forming the first dielectric layer includes performing a thermal oxidation process, for example. The second dielectric layer has a thickness between 15~150 and the method of forming the second dielectric layer includes performing a thermal oxidation process, for example.

According to the method of forming a gate dielectric layer in the preferred embodiment of the present invention, the method of removing the first dielectric layer in the low-voltage circuit region includes the following steps. First, a photoresist layer is formed over the substrate in the high-voltage circuit region. Using the photoresist layer as a mask, the first dielectric layer in the low-voltage circuit is etched. Finally, the photoresist layer is removed. The method of etching the first dielectric layer in the low-voltage circuit region includes performing a wet etching operation, for example.

According to the method of forming a gate dielectric layer in the preferred embodiment of the present invention, the method of patterning the mask layer, the first dielectric layer and the substrate to form trenches includes the following steps. First, a patterned photoresist layer is formed over the mask layer. Using the patterned photoresist layer as a mask, the mask layer, the first dielectric layer and the substrate are etched to form trenches in the substrate. Thereafter, the patterned photoresist layer is removed. The method of etching the mask layer, the first dielectric layer and the substrate includes performing a dry etching operation.

According to the method of forming a gate dielectric layer in the preferred embodiment of the present invention, after forming the trenches, further includes forming line oxide layers on the sidewalls of the trenches. The method of forming the liner oxide layer includes performing a thermal oxidation process, for example.

According to the method of forming a gate dielectric layer in the preferred embodiment of the present invention, the method of forming an isolation layer includes performing a high-density plasma chemical vapor deposition process, for example. If a portion of the isolation layer covers beyond the surface of the mask layer, a chemical-mechanical polishing operation is carried out to the isolation layer above the mask layer using the mask layer as a stopping layer. The etching process is an isotropic etching process, for example.

Unlike the conventional method of forming a pad oxide layer first, a gate oxide layer is formed on the substrate in the high-voltage circuit region in the present invention. Hence, the problem of having a depression in the shallow trench isolation structures of the low-voltage circuit region is removed and the junction leakage is minimized. As a result, the device can operate with lower power consumption and higher operating speed. In addition, the silicon oxide bird's beak formed at the corner regions of the trenches in the process of depositing liner oxide material on the trenches can prevent the thinning of the gate dielectric layer at the corner regions of the shallow trench isolation structures. Consequently, overall reliability and stability of the device is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 2A:
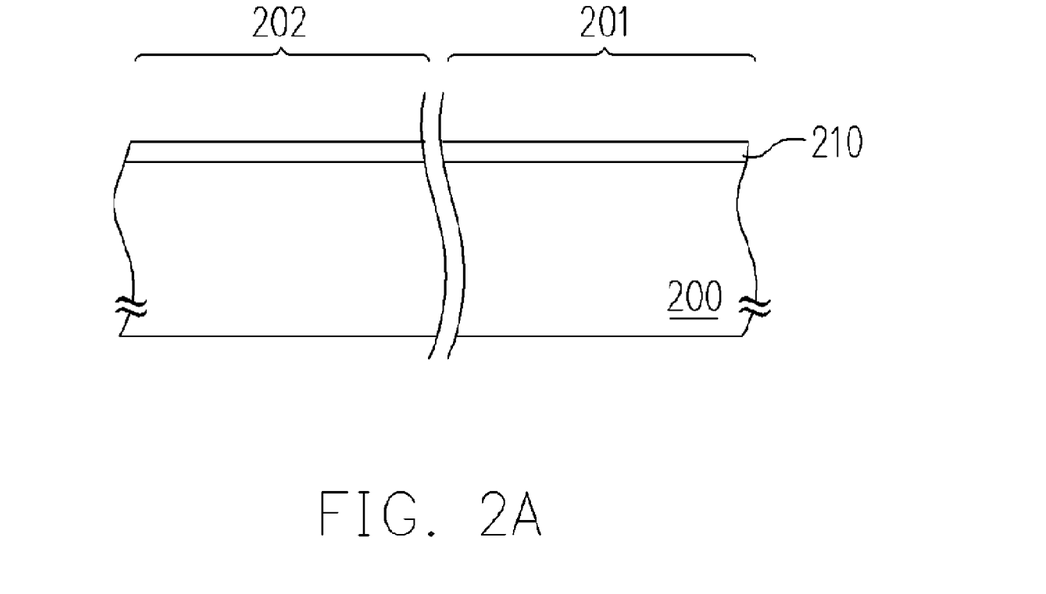
FIGS. 2A through 2F are schematic cross-sectional views showing the process of fabricating a gate oxide layer according to one preferred embodiment of the present invention.

FIGS. 2A through 2F are schematic cross-sectional views showing the process of fabricating a gate oxide layer according to one preferred embodiment of the present invention. As shown in FIG. 2A, a substrate 200 divided at least into a high-voltage circuit region 201 and a low-voltage circuit region 202 is provided. Then, the substrate 200 is cleaned using, for example, an RCA solution (a solution mixture containing ammonia $NH_4OH$ and hydrogen peroxide $H_2O_2$). Thereafter, a dielectric layer 210 is formed over the substrate 200. Since the dielectric layer 210 serves as a gate dielectric layer in the high-voltage circuit region 201, it has a thickness greater than a conventional pad oxide layer. Typically, the dielectric layer 210 has a thickness between 200 Å~1000 Å. The method of forming the dielectric layer 210 includes performing a thermal oxidation process, for example.

Figure 2B:
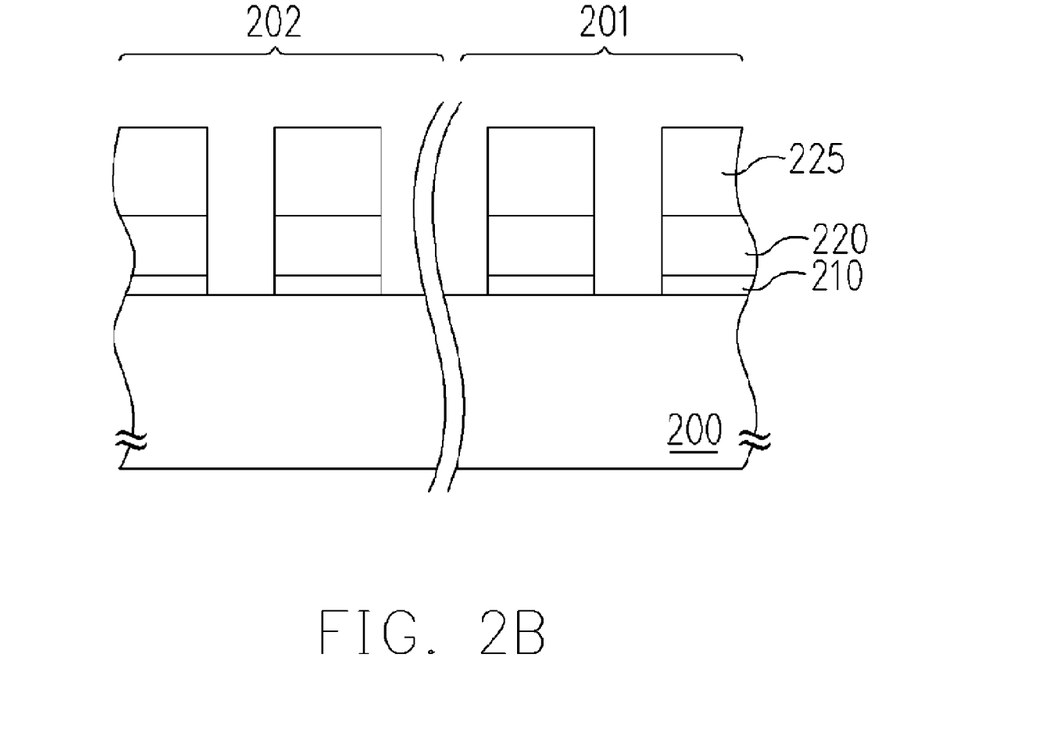

As shown in FIG. 2B, a mask layer 220 is formed over the dielectric layer 210. The mask layer 220 is a silicon nitride layer formed, for example, by performing a chemical vapor deposition process. The mask layer 220 has a thickness between about 800 Å~2000 Å, for example.

Thereafter, a patterned photoresist layer 225 is formed over the mask layer 220. Using the patterned photoresist layer 225 as a mask, the mask layer 220 and the dielectric layer 210 are etched. The patterned photoresist layer 225 is a positive photoresist formed, for example, by spin-coating photoresist material over the mask layer to form the photoresist layer (not shown) and performing a chemical development after a exposure process thereafter. The method of etching the mask layer 220 and the dielectric layer 210 includes performing a dry etching operation, for example.

Figure 2C:
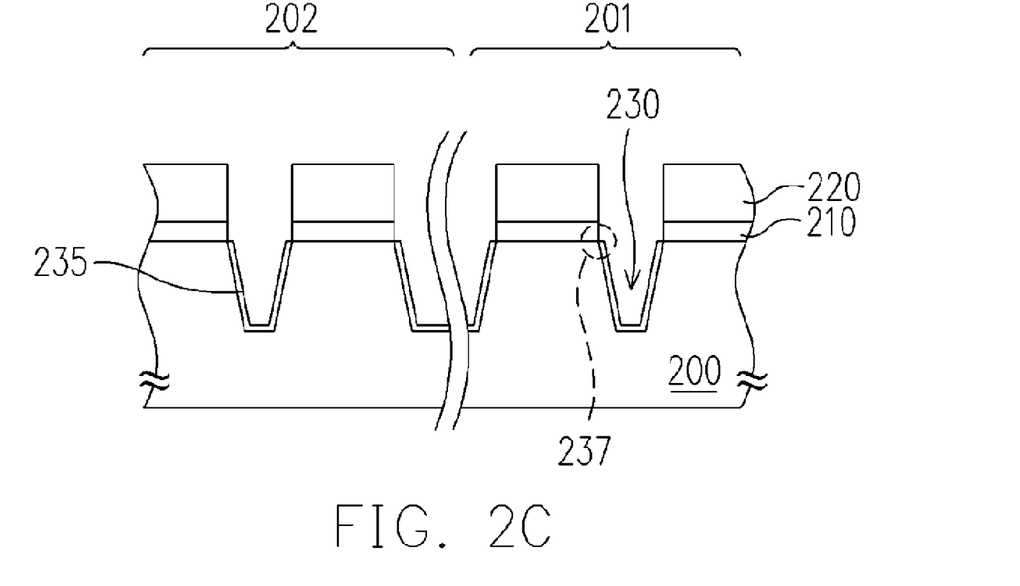

As shown in FIG. 2C, the photoresist layer 225 is removed. The method of removing the photoresist layer 225 includes, for example, performing a dry photoresist etching or a wet photoresist etching operation. Thereafter, using the mask layer 220 as a mask, the substrate 200 is etched to form trenches 230. The trenches 230 serve as trenches for forming shallow trench isolation structures. The substrate 200 is etched by performing a dry etching operation, for example. After that, a liner oxide layer 235 is formed on the sidewalls of the trenches 230 to repair lattice defects on the surface of the trenches 230 due to the dry etching operation. The liner oxide layer 235 having a thickness between 80 Å~500 Å is formed, for example, by performing a thermal oxidation process.

Figure 3:
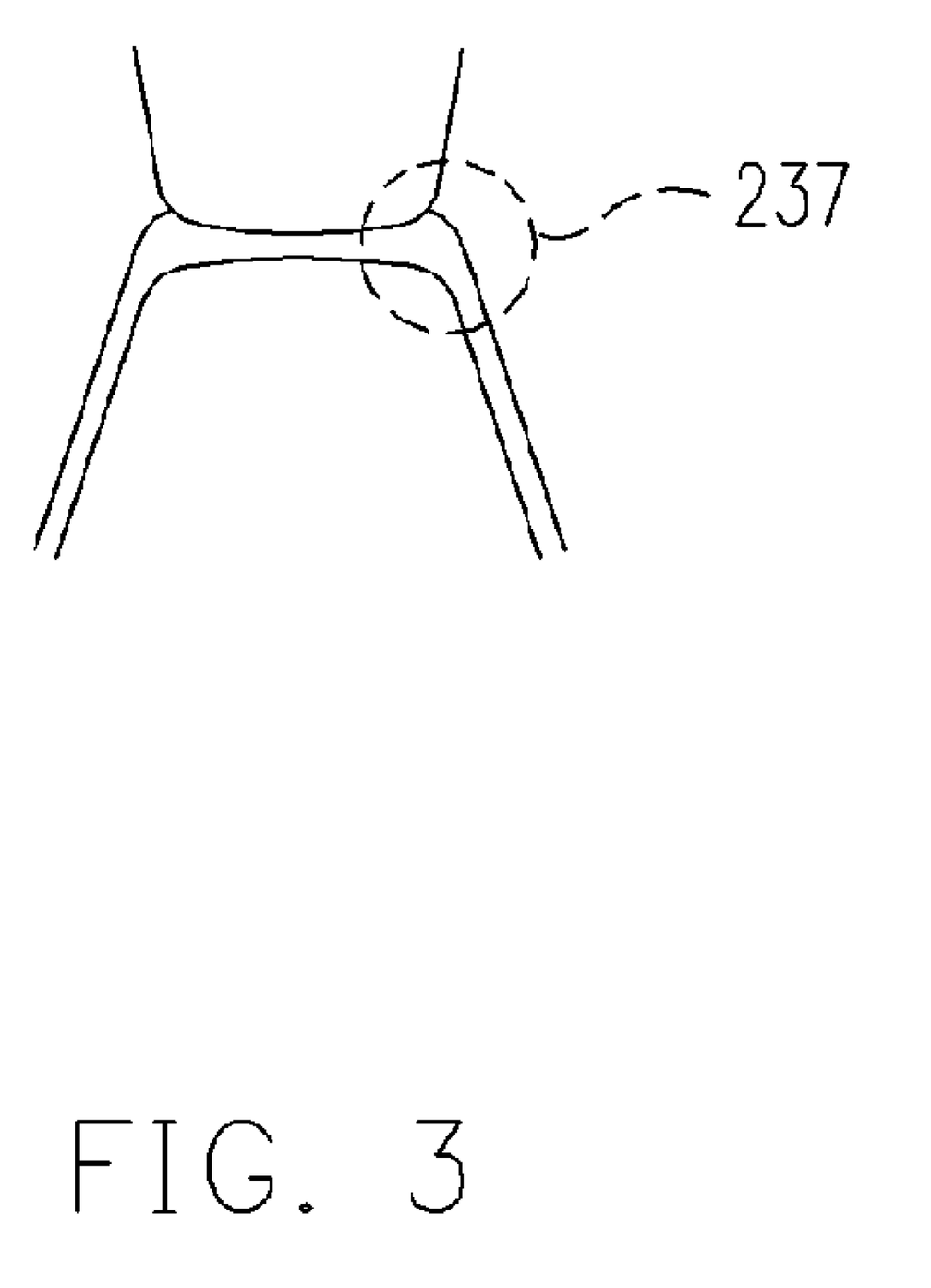
FIG. 3 is a partially magnified cross-sectional view of FIG. 2C in the process of fabricating a gate dielectric layer according to one preferred embodiment of the present invention.

In FIG. 2C, a bird's beak formation 237 is shown to form at the corner regions of the trenches after the liner oxide layer 235 is formed. FIG. 3 is a partially magnified cross-sectional view of FIG. 2C in the process of fabricating a gate dielectric layer according to one preferred embodiment of the present invention. Due to the formation of a bird's beak, the thickness of the silicon oxide at the corner regions is increased thereby minimizing the thinning of the gate oxide layer in the high-voltage circuit region of a conventional design.

Figure 2D:
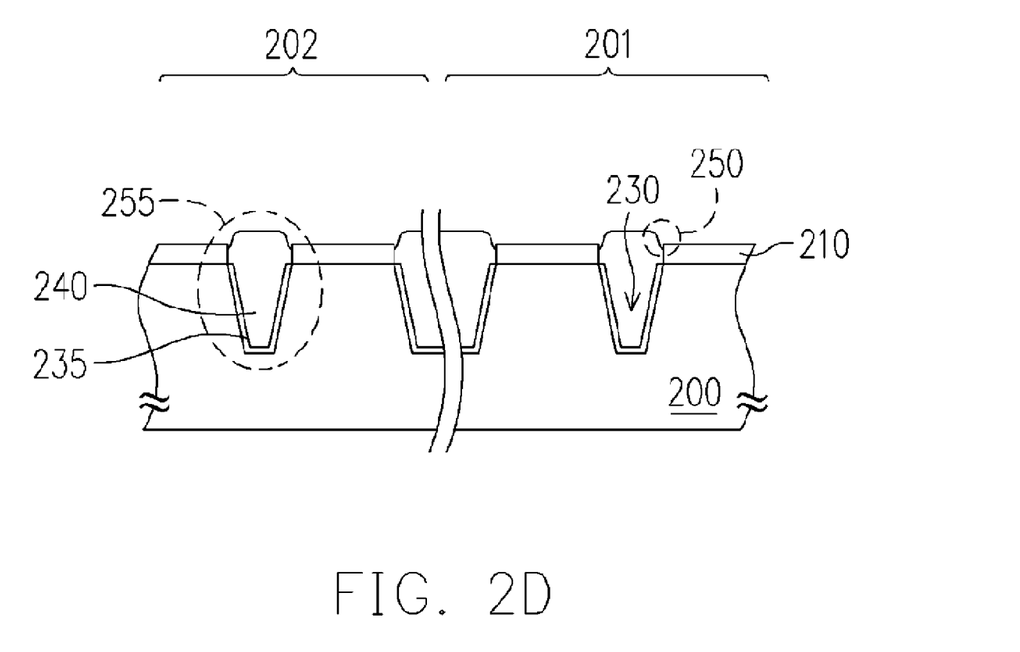

As shown in FIG. 2D, an isolation layer 240 is formed over the substrate 200. The isolation layer 240 completely fills the trenches 230 and covers the substrate 200. The isolation layer 240 serves as the isolation structure in the shallow trench isolation structures. The isolation layer 240 is fabricated using silicon oxide or some other suitable materials. The isolation layer 240 is formed, for example, by performing a high-density plasma chemical vapor deposition (HDPCVD) process. Typically, the isolation layer 240 has a thickness of between about 4000 Å~7000 Å from the bottom of the trenches 230. Thereafter, the mask layer 220 is removed to form shallow trench isolation structures 255. The method of removing the mask layer 220 includes performing an isotropic etching operation, for example. If parts of the isolation layer 240 protrudes from the surface of the mask layer 220, a chemical-mechanical polishing operation can be carried out using the mask layer 220 as a stop layer to remove the isolation layer 240 above the mask layer 220 before removing the mask layer 220.

In FIG. 2D, because the mask layer 220 is removed in an isotropic etching operation, the undercut phenomenon will occur leading to the formation of divots 250 between the isolation layer 240 and the dielectric layer 210 similar to the divots 150 in the conventional technique shown in FIG. 1C. Although the two divots seem similar, they are different in practice. The divots 150 in FIG. 1C are adjacent to the substrate 100 and expose a portion of the substrate 100 for forming a doped region (a source/drain region) subsequently. With a thicker dielectric layer 210 in FIG. 2D in the present invention, the divots 250 are in contact with the dielectric layer 210 only without exposing the substrate 200. In other words, the divots 250 are disposed in a location incapable of forming the so-called parasitic transistor. Therefore, the kink effect caused by a sub-threshold current in the conventional design can be prevented. Consequently, overall reliability and stability of the device are improved and the product yield is increased.

Figure 2E:
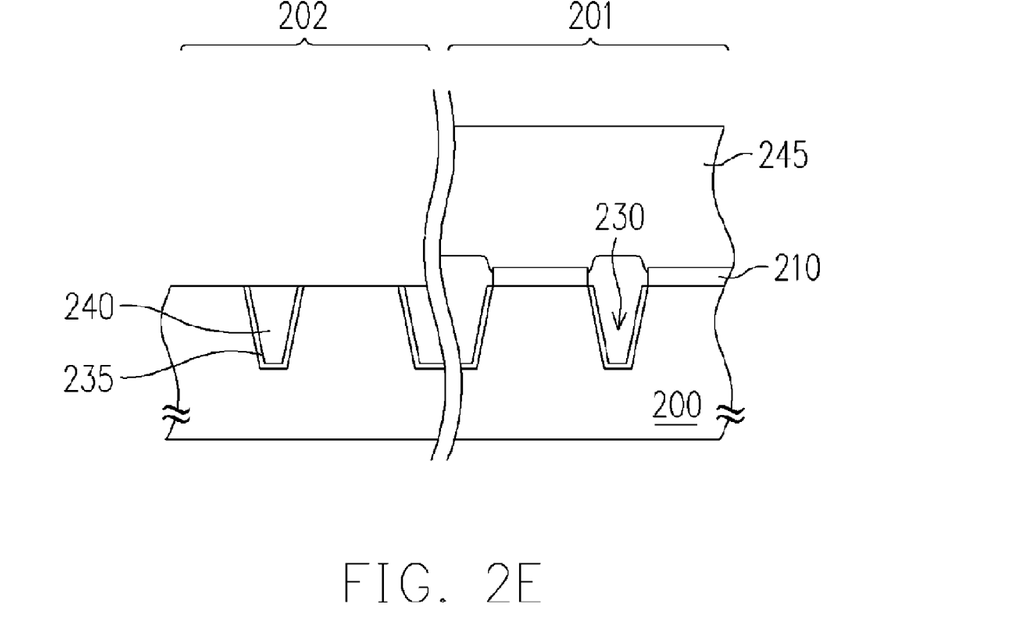

As shown in FIG. 2E, the dielectric layer 210 in the low-voltage circuit region 202 is removed to expose the surface of the substrate 200. The method of removing the dielectric layer 210 in the low-voltage circuit region 202 includes forming a photoresist layer 245 over the high-voltage circuit region 201 of the substrate 200 and etching the dielectric layer 210 in the low-voltage circuit region 202 using the photoresist layer 245 as a mask. The photoresist layer 245 is a positive photoresist layer formed, for example, by spin-coating photoresist material over the substrate 200 to form a photoresist layer (not shown) and chemically developing the photoresist layer after a photo-exposure process. The method of removing the dielectric layer 210 from the low-voltage circuit region 202 includes performing a wet etching operation, for example.

In the aforementioned embodiment, the isolation layer 240 and the dielectric layer 210 are fabricated from an identical material. Hence, a portion of the isolation layer 240 will also be removed in the process of removing the dielectric layer 210 from the low-voltage circuit region 202. However, comparing the technique in FIG. 2E of the present invention with FIG. 1D in the prior technique, the method of fabricating the gate dielectric layer disclosed in the present invention will not produce a depression in the low-voltage circuit region 202. This is because a dielectric layer 201 having a thickness greater than the conventional pad oxide layer is formed over the substrate 200 early on. Furthermore, unlike the conventional process, there is neither a need to remove a pad oxide layer nor a need to remove the oxide layer in the low-voltage circuit region after forming a suitable oxide layer in the high-voltage circuit region in the present invention. Thus, the isolation layer 240 in the isolation structures will not form a depression when the dielectric layer 210 is removed from the low-voltage circuit region 202. As a result, junction leakage can be prevented leading to a lower power rating and a faster operating speed for the device.

Figure 2F:
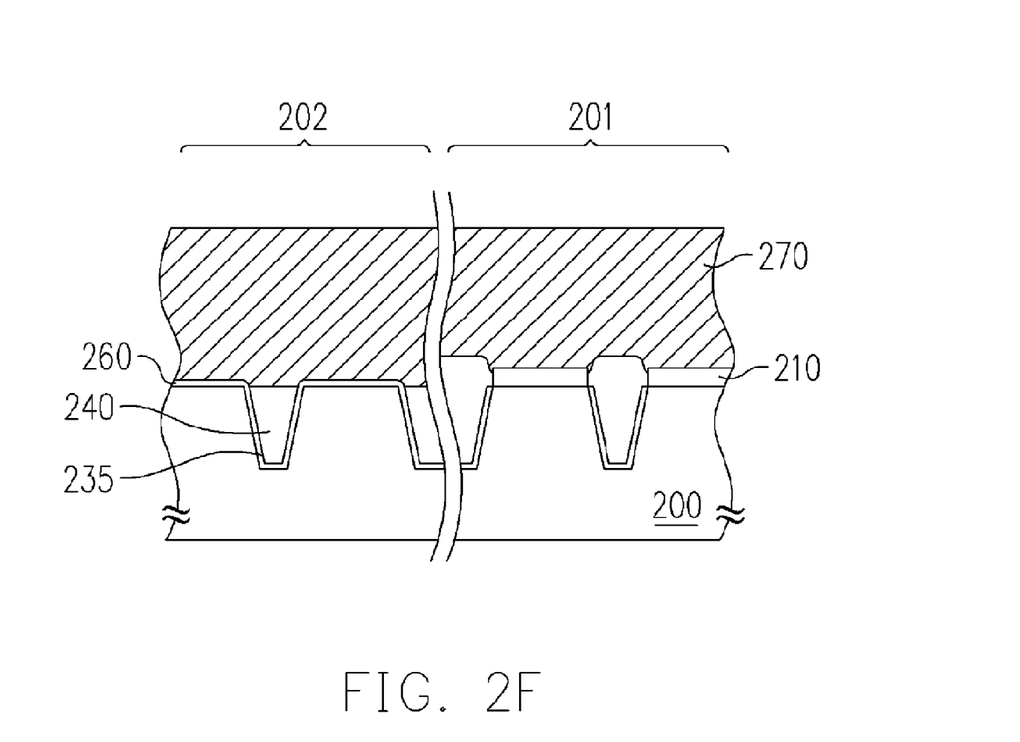

As shown in FIG. 2F, the photoresist layer 245 on the high-voltage circuit region 201 is removed in a wet photoresist etching or a dry photoresist etching operation, for example. Then, a dielectric layer 260 is formed over the substrate 200. The method of forming the dielectric layer 260 includes performing a thermal oxidation process, for example. Th dielectric layer 260 has a thickness smaller than the dielectric layer 210. Typically, the dielectric layer 260 has a thickness between about 15 Å~150 Å. In addition, the method of forming the dielectric layer 260 may include retaining the photoresist layer 245 on the high-voltage circuit region 201 and forming the dielectric layer 260 directly over the substrate 200 in a chemical vapor deposition process. Thereafter, the photoresist layer 245 is removed.

Thereafter, a conductive layer 270 is formed over the dielectric layer 260 and the dielectric layer 210. The conductive layer 270 is a doped polysilicon layer formed, for example, by depositing undoped polysilicon material in a chemical vapor deposition process to form an undoped polysilicon layer (not shown) and performing an ion implant process thereafter. Obviously, the conductive layer 270 can be formed in a chemical vapor deposition process with in-situ doping. Since the subsequent processes depend on the type of devices desired and should be familiar to those skilled in the fabricating technique, a detailed description is omitted.

In summary, unlike the conventional method of forming a pad oxide layer first and then removing it thereafter, the gate oxide layer is directly formed on the substrate in the high-voltage circuit region in the present invention. This not only simplifies the processing steps, but also reduces production cost and processing time. Furthermore, the problem of having a depression in the shallow trench isolation structures of the low-voltage circuit region is removed and the junction leakage is minimized. As a result, the device can operate with lower power consumption and higher operating speed. In addition, the silicon oxide bird's beak formed at the corner regions of the trenches in the process of depositing liner oxide material on the trenches can prevent the thinning of the gate dielectric layer at the corner regions of the shallow trench isolation structures. Consequently, overall reliability and stability of the device is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a gate dielectric layer, comprising:
    providing a substrate divided into at least a high-voltage circuit region and a low-voltage circuit region;
    forming a first dielectric layer over the substrate, wherein the first dielectric layer serves as a gate dielectric layer in the high-voltage circuit region;
    forming a mask layer over the first dielectric layer;
    patterning the mask layer, the first dielectric layer and the substrate to form a trench in the substrate;
    forming an isolation layer over the substrate to fill the trench;
    removing the mask layer to expose the surface of the first dielectric layer;
    removing the first dielectric layer in the low-voltage circuit region to expose the surface of the substrate; and
    forming a second dielectric layer over the substrate in the low-voltage circuit region, wherein the second dielectric layer has a thickness smaller than the first dielectric layer.

2. The method of claim 1, wherein the first dielectric layer has a thickness between about 200 Å~1000 Å.

3. The method of claim 1, wherein the step of forming the first dielectric layer comprises performing a thermal oxidation process.

4. The method of claim 1, wherein the step of removing the first dielectric layer in the low-voltage circuit region comprises:
    forming a photoresist layer over the substrate in the high-voltage circuit region;
    using the photoresist layer as a mask and removing the first dielectric layer in the low-voltage circuit region; and
    removing the photoresist layer.

5. The method of claim 4, wherein the step of removing the first dielectric layer in the low-voltage circuit region comprises performing a wet etching operation.

6. The method of claim 1, wherein the step of patterning the mask layer, the first dielectric layer and the substrate to form a trench comprises:
    forming a patterned photoresist layer over the mask layer;
    using the patterned photoresist layer as a mask and removing a part of the mask layer, the first dielectric layer and the substrate to form a trench in the substrate; and
    removing the patterned photoresist layer.

7. The method of claim 6, wherein the step of removing a part of the mask layer, the first dielectric layer and the substrate to form a trench in the substrate comprises performing a dry etching operation.

8. The method of claim 1, wherein after forming the trench, further comprises forming a liner oxide layer over the sidewalls of the trench.

9. The method of claim 8, wherein the step of forming the liner oxide layer comprises performing a thermal oxidation process.

10. The method of claim 1, wherein if a portion of the isolation layer protrudes over the surface of the mask layer, further comprises:
    using the mask layer as a stop layer and performing a chemical-mechanical polishing operation to remove the isolation layer above the mask layer.

11. The method of claim 10, wherein the step of etching the mask layer, the first dielectric layer and the substrate to form a trench in the substrate comprises performing an isotropic etching process.

12. The method of claim 1, wherein the step of forming the isolation layer comprises performing a high-density plasma chemical vapor deposition process.

13. The method of claim 1, wherein before forming the first dielectric layer, further comprises performing a RCA cleaning procedure.

14. The method of claim 1, wherein the second dielectric layer has a thickness between about 15 Å~150 Å.

15. The method of claim 1, wherein the step of forming the second dielectric layer comprises performing a thermal oxidation process.

* * * * *